(12) United States Patent  
Shibata

(10) Patent No.: US 11,726,745 B2  
(45) Date of Patent: Aug. 15, 2023

(54) PRODUCT-SUM OPERATION DEVICE, NEUROMORPHIC DEVICE, AND METHOD FOR USING PRODUCT-SUM OPERATION DEVICE

(71) Applicant: TDK CORPORATION, Tokyo (JP)

(72) Inventor: Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 518 days.

(21) Appl. No.: 16/957,359

(22) PCT Filed: Dec. 12, 2018

(86) PCT No.: PCT/JP2018/045726  
§ 371 (c)(1),  
(2) Date: Jun. 23, 2020

(87) PCT Pub. No.: WO2019/131142  
PCT Pub. Date: Jul. 4, 2019

(65) Prior Publication Data  
US 2020/0334017 A1 Oct. 22, 2020

(30) Foreign Application Priority Data  
Dec. 28, 2017 (JP) .................. 2017-254701

(51) Int. Cl.  
*H10B 61/00* (2023.01)  
*G06F 7/544* (2006.01)  
(Continued)

(52) U.S. Cl.  
CPC ........... *G06F 7/5443* (2013.01); *G06N 3/065* (2023.01); *H10B 61/00* (2023.02); *H10N 50/80* (2023.02)

(58) Field of Classification Search  
None  
See application file for complete search history.

(56) References Cited

U.S. PATENT DOCUMENTS 10,242,737 B1 * 3/2019 Lin ...................... G06N 3/063  
2010/0073025 A1 * 3/2010 Tanamoto ........... H03K 19/1776  
326/39

(Continued)

FOREIGN PATENT DOCUMENTS

JP H09-288805 A 11/1997  
JP 2008-118010 A 5/2008  
(Continued)

OTHER PUBLICATIONS

Chen, Z. et al., "Optimized Learning Scheme for Grayscale Image Recognition in a RRAM Based Analog Neuromorphic System," IEEE, pp. 17.7.1-17.7.4, 2015.

(Continued)

*Primary Examiner* — Hung K Vu  
(74) *Attorney, Agent, or Firm* — Oliff PLC

(57) ABSTRACT

A product-sum operation device, a neuromorphic device, and a method for using the product-sum operation device are provided which can, when applied to a neural network, curb the possibility that the performance of the neural network may be greatly impaired. The product-sum operation device includes a product operator and a sum operator. The product operator includes a plurality of product operation elements, each of which is a resistance change element. The sum operator includes an output detector that detects the sum of outputs from the plurality of product operation elements and the resistance change element includes a fuse portion which is disconnected when a malfunction which increases an output current from the resistance change element has occurred in the resistance change element.

17 Claims, 9 Drawing Sheets

(51) Int. Cl.
    *G06N 3/065*    (2023.01)
    *H10N 50/80*    (2023.01)

(56) References Cited

U.S. PATENT DOCUMENTS

| | | | |
|---|---|---|---|
| 2011/0194221 A1* | 8/2011 | Ohta | G01R 33/098 |
| | | | 361/63 |
| 2018/0082168 A1* | 3/2018 | Marukame | G06N 3/065 |
| 2018/0350432 A1 | 12/2018 | Sasaki | |
| 2019/0171418 A1 | 6/2019 | Morie et al. | |

FOREIGN PATENT DOCUMENTS

| | | |
|---|---|---|
| JP | 2010-081172 A | 4/2010 |
| JP | 2011-185918 A | 9/2011 |
| JP | 5131499 B2 | 1/2013 |
| JP | 5160304 B2 | 3/2013 |
| WO | 2017/183573 A1 | 10/2017 |
| WO | 2018/034163 A1 | 2/2018 |

OTHER PUBLICATIONS

Jan. 13, 2023 Office Action issued in Chinese Patent Application No. 201880084233.0.

Okazaki, A., "Hardware Technologies for Neuromorphic Computing," Journal of the Robotics Society of Japan, vol. 35, No. 3., pp. 37-42, 2017.

Burr, G.W. et al., "Neuromorphic Computing Using Non-Volatile Memory," Advances in Physics: X, vol. 2, No. 1, pp. 89-124, 2017.

Mar. 5, 2019 International Search Report issued in International Patent Application No. PCT/JP2018/045726.

* cited by examiner

PRODUCT-SUM OPERATION DEVICE, NEUROMORPHIC DEVICE, AND METHOD FOR USING PRODUCT-SUM OPERATION DEVICE

TECHNICAL FIELD

The present invention relates to a product-sum operation device, a neuromorphic device, and a method for using the product-sum operation device. Priority is claimed on Japanese Patent Application No. 2017-254701, filed Dec. 28, 2017, the content of which is incorporated herein by reference.

BACKGROUND ART

In the related art, a learning scheme optimized for grayscale image recognition in an RRAM (registered trademark)-based analog neuromorphic system is known (see, for example, Non-Patent Literature 1). This literature describes development of an analog neuromorphic system on the basis of an assembled resistance switching memory array. This literature proposes a new training scheme to optimize the performance of analog systems by utilizing segmented synaptic behaviors. This literature also applies the scheme to grayscale image recognition.

Research has also been conducted to realize a neural network imitating a nervous system by using an array of resistance change elements. A neuromorphic device (NMD) performs a product-sum operation to product weight and sum values from the previous stage to the next stage. Thus, development of various types of product-sum operation devices, each of which combines a plurality of resistance change elements whose resistances change continuously, performs product operations on input signals using their resistance values as weights, and performs sum operation to obtain the sum of currents output from the resistance change elements, and NMDs using the product-sum operation devices has been promoted.

CITATION LIST

Patent Literature

[Patent Literature 1]
PCT International Publication No. WO2017/183573

Non-Patent Literature

[Non-Patent Literature 1]
Zhe Chen et al., "Optimized Learning Scheme for Grayscale Image Recognition in a RRAM Based Analog Neuromorphic System," 2015, IEEE, p. 17.7.1-p. 17.7.4

SUMMARY OF INVENTION

Technical Problem

However, Non-Patent Literature 1 does not discuss a technique for detecting a malfunction that may greatly impair the performance of a neural network. If a resistance change element malfunctions and the resistance thereof decreases, the weight of the malfunctioning resistance change element may greatly affect the network during product-sum operation. Therefore, in the neural network, it is very important to avoid a malfunction of a resistance change element due to short-circuiting.

In view of the above problems, it is an object of the present invention to provide a product-sum operation device, a neuromorphic device, and a method for using the product-sum operation device which can, when applied to a neural network, curb the possibility that the performance of the neural network may be greatly impaired upon the occurrence of an element malfunction.

Solution to Problem

A product-sum operation device of an aspect of the present invention includes a product operator and a sum operator, wherein the product operator includes a plurality of product operation elements, each of the plurality of product operation elements is a resistance change element, the sum operator includes an output detector configured to detect a sum of outputs from the plurality of product operation elements, the resistance change element includes a fuse portion, and the fuse portion is disconnected when a malfunction which increases an output current from the resistance change element has occurred in the resistance change element.

In the product-sum operation device of an aspect of the present invention, the output current from the resistance change element after the fuse portion is disconnected may be smaller than the output current from the resistance change element during normal operation of the resistance change element.

In the product-sum operation device of an aspect of the present invention, the resistance change element may have a write terminal, a common terminal, and a read terminal.

In the product-sum operation device of an aspect of the present invention, the fuse portion may be included in the read terminal.

In the product-sum operation device of an aspect of the present invention, the fuse portion may be included in the common terminal.

In the product-sum operation device of an aspect of the present invention, the resistance change element may be a magnetoresistance effect element exhibiting a magnetoresistance effect, and the magnetoresistance effect element may include a magnetization free layer having a domain wall, a magnetization fixed layer whose magnetization direction is fixed, and a nonmagnetic layer sandwiched between the magnetization free layer and the magnetization fixed layer.

In the product-sum operation device of an aspect of the present invention, the read terminal may further include a wiring portion, the output current may flow through the wiring portion and the fuse portion in an order of the wiring portion and the fuse portion or in an order of the fuse portion and the wiring portion, and a cross-sectional area of the fuse portion perpendicular to a direction in which the output current flows may be smaller than a cross-sectional area of the wiring portion perpendicular to the direction in which the output current flows.

In the product-sum operation device of an aspect of the present invention, the read terminal may further include a wiring portion, the output current may flow through the wiring portion and the fuse portion in an order of the wiring portion and the fuse portion or in an order of the fuse portion and the wiring portion, and the fuse portion may be more easily disconnected than the wiring portion when a malfunction which increases the output current has occurred in the resistance change element.

In the product-sum operation device of an aspect of the present invention, the read terminal may further include a wiring portion, the output current may flow through the wiring portion and the fuse portion in an order of the wiring portion and the fuse portion or in an order of the fuse portion and the wiring portion, and a melting point of a material of the fuse portion may be lower than a melting point of a material of the wiring portion.

In the product-sum operation device of an aspect of the present invention, the resistance change element may further include a write terminal, a common terminal, and a read terminal, and the fuse portion may be disposed closer to the read terminal than the magnetization fixed layer is.

In the product-sum operation device of an aspect of the present invention, the resistance change element may further have a via that connects the write terminal or the common terminal and the read terminal, the via may include a small-diameter portion and a large-diameter portion, the output current may flow through the small-diameter portion and the large-diameter portion in an order of the small-diameter portion and the large-diameter portion or in an order of the large-diameter portion and the small-diameter portion, and the small-diameter portion may function is the fuse portion.

In the product-sum operation device of an aspect of the present invention, the common terminal (AB) may include a small-diameter portion and a large-diameter portion, the output current may flow through the small-diameter portion and the large-diameter portion in an order of the small-diameter portion and the large-diameter portion or in an order of the large-diameter portion and the small-diameter portion, and the small-diameter portion may function is the fuse portion.

In the product-sum operation device of an aspect of the present invention, the common terminal may further include a wiring portion, the output current may flow through the wiring portion and the fuse portion in an order of the wiring portion and the fuse portion or in an order of the fuse portion and the wiring portion, and a cross-sectional area of the fuse portion perpendicular to a direction in which the output current flows may be smaller than a cross-sectional area of the wiring portion perpendicular to the direction in which the output current flows.

In the product-sum operation device of an aspect of the present invention, the common terminal may further include a wiring portion, the output current may flow through the wiring portion and the fuse portion in an order of the wiring portion and the fuse portion or in an order of the fuse portion and the wiring portion, and the fuse portion may be more easily disconnected than the wiring portion when a malfunction which increases the output current has occurred in the resistance change element.

In the product-sum operation device of an aspect of the present invention, the common terminal may further include a wiring portion, the output current may flow through the wiring portion and the fuse portion in an order of the wiring portion and the fuse portion or in an order of the fuse portion and the wiring portion, and a melting point of a material of the fuse portion may be lower than a melting point of a material of the wiring portion.

In the product-sum operation device of an aspect of the present invention, the resistance change element may further have a via and a low-melting-point material layer that connect the write terminal or the common terminal and the read terminal, the output current may flow through the via and the low-melting-point material layer in an order of the via and the low-melting-point material layer or in an order of the low-melting-point material layer and the via, and the low-melting-point material layer may function is the fuse portion.

In the product-sum operation device of an aspect of the present invention, the resistance change element may further have a via that connects the write terminal or the common terminal and the read terminal, the via may include a wiring material portion and a low-melting-point material portion having a lower melting point than the wiring material portion, the output current may flow through the wiring material portion and the low-melting-point material portion in an order of the wiring material portion and the low-melting-point material portion or in an order of the low-melting-point material portion and the wiring material portion, and the low-melting-point material portion may function is the fuse portion.

A neuromorphic device of an aspect of the present invention includes the product-sum operation device.

A neuromorphic device of an aspect of the present invention includes the product-sum operation device, wherein the resistance change element has a write terminal, a common terminal, and a read terminal, the resistance change element is a magnetoresistance effect element exhibiting a magnetoresistance effect and including a magnetization free layer having a domain wall, a magnetization fixed layer whose magnetization direction is fixed, and a nonmagnetic layer sandwiched between the magnetization free layer and the magnetization fixed layer, the fuse portion is included in the common terminal, and the fuse portion is disposed closer to an outer surface of the neuromorphic device than the magnetization free layer, the magnetization fixed layer, and the nonmagnetic layer are.

A method for using the product-sum operation device of an aspect of the present invention includes a first step of applying a voltage higher than a read voltage of the resistance change element to the plurality of product operation elements, and a second step of applying the read voltage to at least one of the plurality of product operation elements.

Advantageous Effects of Invention

According to the present invention, it is possible to provide a product-sum operation device, a neuromorphic device, and a method for using the product-sum operation device which can, when applied to a neural network, curb the possibility that the performance of the neural network may be greatly impaired upon the occurrence of a malfunction in a resistance change element.

BRIEF DESCRIPTION OF DRAWINGS

FIG. 3 is a diagram illustrating changes in an output current from a magnetoresistance effect element via a read terminal and the like.

DESCRIPTION OF EMBODIMENTS

Hereinafter, embodiments of a product-sum operation device, a neuromorphic device, and a method for using the product-sum operation device according to the present invention will be described with reference to the drawings.

<First Embodiment> (where Resistance Change Elements are Magnetoresistance Effect Elements and No Destruction Process is Applied)

Figure 1:
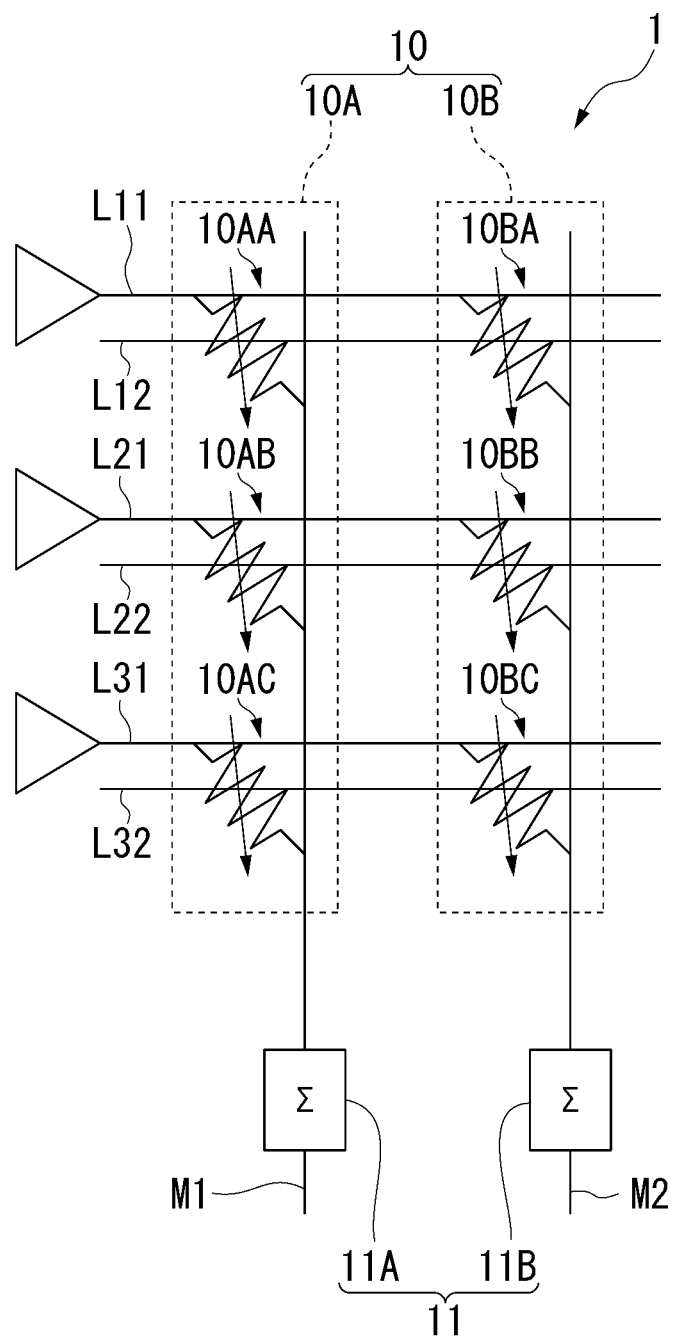
FIG. 1 is a diagram illustrating an exemplary configuration of a product-sum operation device of a first embodiment.

FIG. 1 is a diagram showing an exemplary configuration of a product-sum operation device 1 of a first embodiment.

In the example shown in FIG. 1, the product-sum operation device 1 of the first embodiment includes a product operator 10 and a sum operator 11. The product operator 10 includes a column 10A and a column 10B.

In the example shown in FIG. 1, the product operator 10 includes two columns 10A and 10B. However, in another example, the product operator 10 may include three or more columns 10A, 10B, . . . .

In the example shown in FIG. 1, the column 10A includes a product operation element 10AA, a product operation element 10AB, and a product operation element 10AC. The column 10B includes a product operation element 10BA, a product operation element 10BB, and a product operation element 10BC.

In the example shown in FIG. 1, the column 10A includes three product operation elements 10AA, 10AB, and 10AC, and the column 10B includes three product operation elements 10BA, 10BB, and 10BC. However, in another example, the column 10A may include a plurality of product operation elements other than three and the column 10B may include a plurality of product operation elements other than three.

In the example shown in FIG. 1, each of the plurality of product operation elements 10AA to 10AC and 10BA to 10BC is a resistance change element having a read terminal, a write terminal, and a common terminal.

The read terminals of the product operation elements 10AA and 10BA are connected to a line L11. The write terminals of the product operation elements 10AA and 10BA are connected to a line L12.

The read terminals of the product operation elements 10AB and 10BB are connected to a line L21. The write terminals of the product operation elements 10AB and 10BB are connected to a line L22.

The read terminals of the product operation elements 10AC and 10BC are connected to a line L31. The write terminals of the product operation elements 10AC and 10BC are connected to a line L32.

The common terminals of the product operation elements 10AA, 10AB, and 10AC are connected to a line M1. The common terminals of the product operation elements 10BA, 10BB, and 10BC are connected to a line M2.

The sum operator 11 includes an output detector 11A that detects the sum of outputs from the product operation elements 10AA, 10AB, and 10AC, and an output detector 11B that detects the sum of outputs from the product operation elements 10BA, 10BB, and 10BC. The output detector 11A is disposed on the line M1. The output detector 11B is disposed on the line M2.

In the example shown in FIG. 1, the output detector 11A detects output current values from the product operation elements 10AA, 10AB, and 10AC, and the output detector 11B detects output current values from the product operation elements 10BA, 10BB, and 10BC. In another example, the output detector 11A may detect outputs charges from the product operation elements 10AA, 10AB, and 10AC, and the output detector 11B may detect outputs charges from the product operation elements 10BA, 10BB, and 10BC.

(Resistance Change Element)

Resistance change elements used as the product operation elements in the present invention are elements whose electric resistance reversibly changes in response to an external stimulus (such as a current, a voltage, or a magnetic field). Examples of the resistance change elements include a resistance change memory (RRAM) element, a phase-change memory (PCRAM) element, an anisotropic magnetoresistance effect (AMR) element, a tunnel magnetoresistance effect (TMR) element, and a giant magnetoresistance effect (GMR) element.

Figure 2:
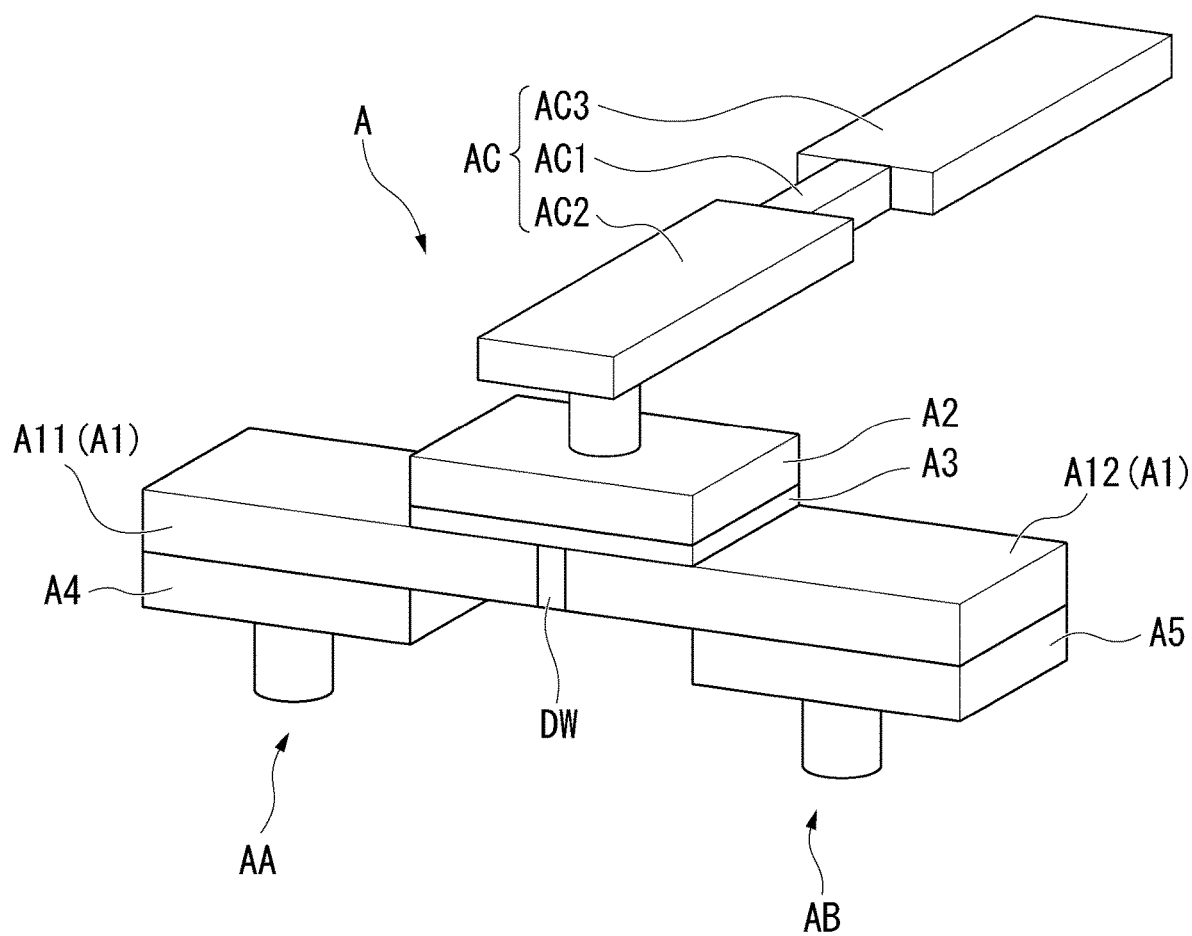
FIG. 2 is a perspective view showing a first example of a resistance change element applicable to the product-sum operation device of the first embodiment.

FIG. 2 is a perspective view showing a first example of a resistance change element applicable to the product-sum operation device 1 of the first embodiment.

In the example shown in FIG. 2, the resistance change element is a magnetoresistance effect element A exhibiting a magnetoresistance effect.

The magnetoresistance effect element A includes a magnetization free layer A1 having a domain wall DW, a magnetization fixed layer A2 whose magnetization direction is fixed, and a nonmagnetic layer A3. The nonmagnetic layer A3 is sandwiched between the magnetization free layer A1 and the magnetization fixed layer A2. The magnetization free layer A1 has a first region A11 on one side of the domain wall DW and a second region A12 on the other side of the domain wall DW. The first region A11 is disposed with a write terminal AA. The second region A12 is provided with a common terminal AB. The magnetization fixed layer A2 is disposed with a read terminal AC.

The amount of movement (movement distance) of the domain wall DW can be variably controlled by adjusting the magnitude and duration of a write current that flows between the write terminal AA and the common terminal AB. The amount of movement (movement distance) of the domain wall DW can be set with the magnitude and duration of the write current, for example, using the number of pulses or the pulse width. When the area of a portion where the magnetization directions of the magnetization fixed layer A2 and the magnetization free layer A1 are parallel (or antiparallel) continuously changes by driving (moving) the domain wall DW, the ratio between the area proportion of the portion where the magnetization directions are parallel and the area proportion of the portion where the magnetization directions are antiparallel continuously changes, thus obtaining a nearly linear resistance change in the magnetoresistance effect element.

Further, data can be read by flowing current between the read terminal AC and the common terminal AB and detecting a resistance corresponding to the ratio between the area proportion of the portion where the magnetization directions are parallel and the area proportion of the portion where the magnetization directions are antiparallel (see, for example, Patent Literature 1).

[Magnetization Fixed Layer A2]

The magnetization fixed layer A2 is a layer in which the magnetization is oriented in a first direction (for example, leftward in FIG. 2) and fixed. Here, the magnetization being fixed means that the magnetization direction does not change (the magnetization is fixed) before and after writing using a write current.

In the example shown in FIG. 2, the magnetization fixed layer A2 is an in-plane magnetization film whose magnetization has in-plane magnetic anisotropy (an in-plane easy magnetization axis). The magnetization fixed layer A2 is not limited to the in-plane magnetization film and may be a perpendicular magnetization film having perpendicular magnetic anisotropy (a perpendicular easy magnetization axis).

When the magnetization fixed layer A2 is an in-plane magnetization film, it has a high MR ratio (magnetoresistance change rate) and is hardly affected by a spin transfer torque (STT) during reading, and thus can increase the reading voltage. On the other hand, when it is desired to miniaturize the element, it is preferable to use a perpendicular magnetization film with a large magnetic anisotropy and a small demagnetizing field.

A known material can be used for the magnetization fixed layer A2. For example, a metal selected from the group consisting of Cr, Mn, Co, Fe, and Ni and an alloy that contains at least one of these metals and exhibits ferromagnetism can be used. An alloy containing these metals and at least one element of B, C, and N can also be used. Specific examples include Co—Fe and Co—Fe—B.

A Heusler alloy such as $Co_2FeSi$ can also be used for the magnetization fixed layer A2. The Heusler alloy includes an intermetallic compound having a chemical composition of $X_2YZ$, where X is a transition metal element or a noble metal element of Co, Fe, Ni or Cu groups in the periodic table, Y is a transition metal element of Mn, V, Cr or Ti groups, which may be of the same elemental species as X, and Z is a typical element of Groups III to V. Examples include $Co_2FeSi$, $Co_2MnSi$, and $Co_2Mn_{1-a}Fe_aAl_bSi_{1-b}$.

The magnetization fixed layer A2 may have a synthetic structure including a ferromagnetic layer and a nonmagnetic layer or a synthetic structure including an antiferromagnetic layer, a ferromagnetic layer, and a nonmagnetic layer. In the latter, the magnetization direction of the magnetization fixed layer A2 is strongly held by the antiferromagnetic layer in the synthetic structure. Therefore, the magnetization of the magnetization fixed layer A2 is hardly affected by the outside.

When the magnetization of the magnetization fixed layer A2 is oriented in the XY plane (the magnetization fixed layer A2 is an in-plane magnetization film), it is preferable to use, for example, NiFe. On the other hand, when the magnetization of the magnetization fixed layer A2 is oriented in the Z direction (the magnetization fixed layer A2 is a perpendicular magnetization film), it is preferable to use, for example, a Co/Ni laminated film or a Co/Pt laminated film. For example, when the magnetization fixed layer A2 is made of [Co(0.24 nm)/Pt(0.16 nm)]6/Ru(0.9 nm)/[Pt(0.16 nm)/Co (0.16 nm)]4/Ta(0.2 nm)/FeB(1.0 nm), this forms a perpendicular magnetization film.

[Nonmagnetic Layer A3]

The nonmagnetic layer A3 is disposed on a lower surface of the magnetization fixed layer A2. In the magnetoresistance effect element A, a change in the magnetization state of the magnetization free layer A1 with respect to the magnetization fixed layer A2 is read as a change in resistance value via the nonmagnetic layer A3. That is, the magnetization fixed layer A2, the nonmagnetic layer A3, and the magnetization free layer A1 function as the magnetoresistance effect element A. When the nonmagnetic layer A3 is made of an insulator, the configuration is similar to that of the tunnel magnetoresistance effect (TMR) element. When the nonmagnetic layer 2 is made of a metal, the configuration is similar to that of a giant magnetoresistance effect (GMR) element.

A known material that can be used for the nonmagnetic layer of the magnetoresistance effect element A can be used as a material of the nonmagnetic layer A3. When the nonmagnetic layer A3 is made of an insulator (i.e., when it is a tunnel barrier layer), $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, a multilayer film or a mixed composition film of these materials, or the like can be used as a material of the nonmagnetic layer A3. Besides these materials, a material in which a part of Al, Si, or Mg is substituted with Zn, Be, or the like can also be used. Among these, MgO and $MgAl_2O_4$ can have a large magnetoresistance ratio (MR ratio) since these are materials capable of realizing coherent tunneling. On the other hand, when the nonmagnetic layer 2 is made of a metal, Cu, Al, Ag, or the like can be used as a material of the nonmagnetic layer A3.

When the nonmagnetic layer A3 is made of an insulator (i.e., when it is a tunnel barrier layer), the thickness thereof is, for example, 25 Å or more.

[Magnetization Free Layer A1]

The magnetization free layer A1 corresponds to a domain wall drive layer of a domain wall drive type (motion type) MRAM.

The magnetization free layer A1 is made of a ferromagnetic material and the magnetization direction inside thereof can be reversed. The magnetization free layer A1 has a first region A11 in which the magnetization is oriented in a second direction opposite to that of the magnetization fixed layer A2, a second region A12 in which the magnetization is oriented in the same direction as the first direction, and a domain wall DW that forms the interface between these regions. The magnetization directions of the first region A11 and the second region A12 are opposite to each other across the domain wall DW. The domain wall DW is moved by changing the composition ratio of the first region A11 and the second region A12 in the magnetization free layer A1.

A known material can be used as a material of the magnetization free layer A1 and in particular a soft magnetic material can be applied. For example, a metal selected from the group consisting of Cr, Mn, Co, Fe, and Ni, an alloy containing at least one of these metals, an alloy containing these metals and at least one element of B, C, and N, or the like can be used. Specific examples of the material for the magnetization free layer A1 include Co—Fe, Co—Fe—B, and Ni—Fe.

A material having a small saturation magnetization can be used as a material of the magnetization free layer A1. For example, when a material having a small saturation magnetization such as (MnGa)As or (InFe)As or a Co/Tb multilayer film or GdFeCo is used, the domain wall DW of the magnetization free layer A1 can be driven with a small current density. Moreover, when these materials are used, the drive speed of the domain wall DW becomes slow.

A material with weak magnetic anisotropy such as NiFe gives a high drive speed to the domain wall DW and allows the domain wall DW to operate at a speed of 100 msec or more. That is, the domain wall DW moves a distance of 1 μm with a pulse of 10 nsec. Accordingly, to move the magnetization free layer A1 in an analog manner in the element, it is necessary to take measures such as applying a minute pulse using an expensive semiconductor circuit or making the magnetization free layer sufficiently long at the expense of the degree of integration. On the other hand, a material with a slow drive speed for the domain wall DW can form an analog memory even when a sufficiently long pulse current is applied or when the length of the magnetization free layer A1 is short.

It is preferable that a perpendicular magnetization film of $Mn_3X$ (X=Ga, Ge) or a perpendicular magnetization film using a multilayer film of Co/Ni, Co/Pt or the like be used for the magnetization free layer A1. These materials allow the domain wall DW to be driven even when the current density for driving the domain wall is small.

The layer of the domain wall DW includes, for example, one selected from the group consisting of Co/Pt, Co/Pd, and CoCrPt.

It is preferable that the extension length of the magnetization free layer A1 in the longitudinal direction be 60 nm or more. If the extension length of the magnetization free layer A1 is less than 60 nm, it tends to form a single magnetic domain and it is difficult to form a domain wall DW in the magnetization free layer A1.

The thickness of the magnetization free layer A1 is not particularly limited as long as it functions as a domain wall drive layer, and may be, for example, 2 nm to 60 nm. When the thickness of the magnetization free layer A1 is 60 nm or more, the possibility that a domain wall is formed in the stacking direction increases. However, whether or not a domain wall is formed in the stacking direction depends on a balance with the shape anisotropy of the magnetization free layer A1. If the thickness of the magnetization free layer A1 is less than 60 nm, it is unlikely that such a domain wall DW will be formed.

The magnetization free layer A1 may have a domain wall pinning portion which stops movement of the domain wall DW on a side of the layer. For example, by providing irregularities, a groove, a bulge, a constriction, a cutout, or the like at a position where it is desired to stop the movement of the domain wall DW of the magnetization free layer A1, it is possible to stop (pin) the movement of the domain wall. When the magnetization free layer A1 has a domain wall pinning portion, this can be configured such that the domain wall no longer moves unless a current of a threshold value or more flows, and the output signal is not analog and can be easily multi-valued.

For example, by forming domain wall pinning portions at intervals of a predetermined distance, the domain wall DW can be held more stably, enabling stable multi-valued recording and also enabling more stable reading of multi-valued output signals.

In the example shown in FIG. 2, in order to form the domain wall DW, a first magnetization supply layer A4 having a magnetization in the first direction which is the direction of the magnetization of the first region A11 and a second magnetization supply layer A5 having a magnetization in the second direction which is the direction of the magnetization of the second region A12 are disposed on both end portions of the magnetization free layer A1 that do not overlap the magnetization fixed layer A2 in plan view.

The same material as the ferromagnetic material that can be used for the magnetization fixed layer A2 can be used as a material of the first magnetization supply layer A4 and the second magnetization supply layer A5.

In the example shown in FIG. 2, in order to form the domain wall DW, the first magnetization supply layer A4 and the second magnetization supply layer A5 are used as layers whose magnetizations are fixed in both end portions of the magnetization free layer A1. However, a spin orbit torque (SOT) wiring that is in contact with the magnetization free layer A1 and extends in a direction crossing the longitudinal direction of the magnetization free layer A1 may also be used for one or both end portions. The spin orbit torque wiring is made of a material that generates a pure spin current by the spin Hall effect when a current flows.

With this configuration, a domain wall can be introduced into the magnetization free layer A1 by flowing a current through both ends of the spin orbit torque wiring without providing a magnetization supply layer as a layer with fixed magnetization. The domain wall can be moved by flowing a current through the magnetization free layer A1 via the spin orbit torque wiring.

In the example shown in FIG. 2, in order to form the domain wall DW, the first magnetization supply layer A4 and the second magnetization supply layer A5 are used as layers whose magnetizations are fixed in both end portions of the magnetization free layer A1. However, a magnetic field application wiring that is electrically insulated from the magnetization free layer A1 and extends in a direction crossing the magnetization free layer A1 may be used for one or both end portions. A magnetic field is generated by Ampere's law by flowing a current through the magnetic field application wiring. The direction of the generated magnetic field can be reversed with the direction of the current flowing through the magnetic field application wiring. Therefore, by disposing a magnetic field application wiring capable of supplying an in-plane magnetization to an end portion of the magnetization free layer A1, an in-plane magnetization with one of the in-plane magnetization directions that are opposite to each other can be supplied to the end portion of the magnetization free layer A1 according to the direction of a current flowing through the magnetic field application wiring. In addition, by disposing a magnetic field application wiring capable of supplying a perpendicular magnetization to an end portion of the magnetization free layer A1, a perpendicular magnetization with one of the perpendicular magnetization directions that are opposite to each other can be supplied to the end portion of the magnetization free layer A1 according to the direction of a current flowing through the magnetic field application wiring.

In the example shown in FIG. 2, in order to form the domain wall DW, the first magnetization supply layer A4 and the second magnetization supply layer A5 are used as layers whose magnetizations are fixed in both end portions of the magnetization free layer A1. However, a voltage application terminal that is connected to the magnetization free layer A1 via an insulating layer may be used for one or both end portions. When a voltage is applied between the magnetization fixed layer A2 and the voltage application terminal, a part of the magnetization of the magnetization free layer A1 is affected by the voltage. For example, when a voltage is applied as a pulse from the voltage application terminal, a part of the magnetization is oriented in a direction perpendicular to the magnetization direction of the magnetization free layer A1 during the voltage application and the magnetization of the magnetization free layer A1 is oriented in a first direction or a second direction opposite thereto when the voltage application has stopped. The magnetization oriented in the perpendicular direction falls into the first direction or the second direction opposite to the first direction with equal probabilities. Thus, by adjusting the timing, the number of times, and the period of applying the pulsed voltage, a part of the magnetization can become oriented into the second direction from the first direction.

A magnetic coupling layer may be provided between the magnetization free layer A1 and the nonmagnetic layer A3. The magnetic coupling layer is a layer that transfers the magnetization state of the magnetization free layer A1. A main function of the magnetization free layer A1 is a layer for driving the domain wall and it is not always possible to select a material suitable for the magnetoresistance effect generated between the magnetization fixed layer A1 and the magnetization free layer A1 sandwiching the nonmagnetic layer A2. In general, it is known that a ferromagnetic material having a BCC structure is good for the magnetization fixed layer A1 and the magnetic coupling layer to generate a coherent tunnel effect in the nonmagnetic layer A2. In particular, it is known that a large output can be obtained when a material having a composition of Co—Fe—B is formed through sputtering as a material of the magnetization fixed layer A1 and the magnetic coupling layer.

In the example shown in FIG. 2, the read terminal AC includes a fuse portion AC1 and wiring portions AC2 and AC3 disposed on both sides of the fuse portion AC1. When an output current from the magnetoresistance effect element A is output via the read terminal AC, the output current flows through the fuse portion AC1 and wiring portions AC2 and AC3 in the order of the wiring portion AC2, the fuse portion AC1, and the wiring portion AC3 (that is, upward in FIG. 2) or flows through the fuse portion AC1 and the wiring portions AC2 and AC3 in the order of the wiring portion AC3, the fuse portion AC1, and the wiring portion AC2 (that is, downward in FIG. 2).

In the example shown in FIG. 2, the cross-sectional area of the fuse portion AC1 perpendicular to the direction in which the output current flows is set smaller than the cross-sectional area of the wiring portions AC2 and AC3 perpendicular to the direction in which the output current flows.

That is, the fuse portion AC1 is configured to be more easily disconnected than the wiring portions AC2 and AC3.

In the example shown in FIG. 2, the fuse portion AC1 is configured to be more easily disconnected than the wiring portions AC2 and AC3 by making the cross-sectional area of the fuse portion AC1 smaller than the cross-sectional area of the wiring portions AC2 and AC3. Also, in another example, the fuse portion AC1 may be configured to be more easily disconnected than the wiring portions AC2 and AC3 by forming the fuse portion AC1 in a meander shape or in a mesh shape.

In still another example, the fuse portion AC1 may be configured to be more easily disconnected than the wiring portions AC2 and AC3 by making the melting point of the material of the fuse portion AC1 lower than the melting point of the material of the wiring portions AC2 and AC3.

In the example shown in FIG. 2, the fuse portion AC1 is disposed closer to the read terminal AC (on the upper side in FIG. 2) than the magnetization fixed layer A2 is. Therefore, it is possible to curb the possibility that the write terminal AA side may be affected by the disconnection of the fuse portion AC1.

Figure 3:
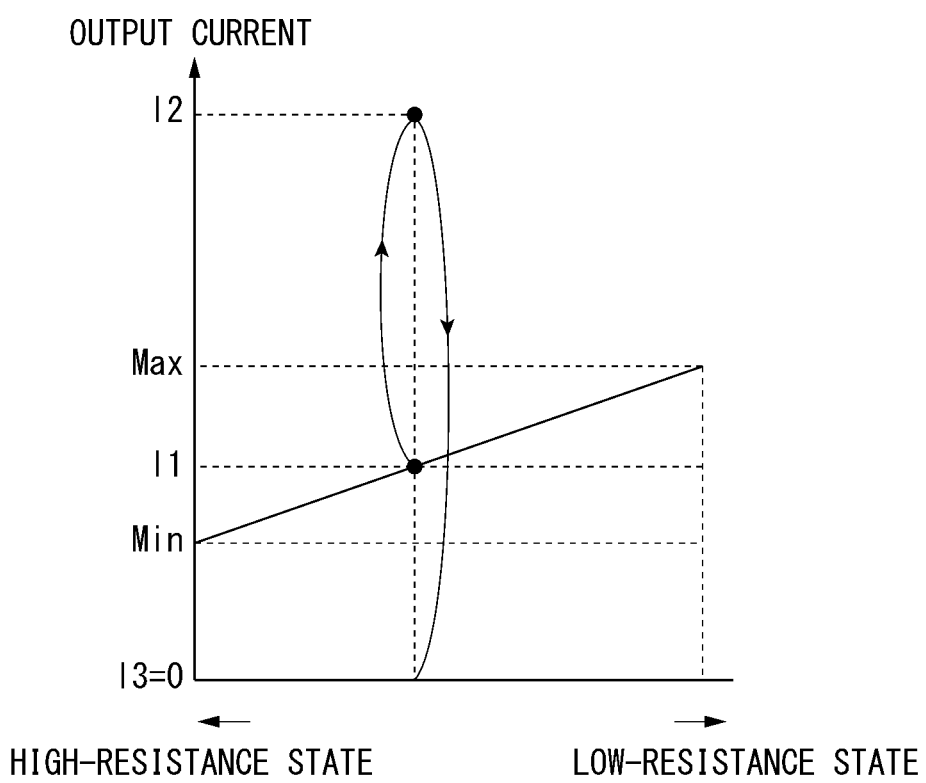

FIG. 3 is a diagram illustrating changes in the output current from the magnetoresistance effect element A via the read terminal AC and the like. In FIG. 3, the vertical axis indicates the output current from the magnetoresistance effect element A via the read terminal AC. The horizontal axis indicates the state (the magnitude of the resistance value) of the magnetoresistance effect element A.

When the magnetoresistance effect element A operates normally and the resistance value of the magnetoresistance effect element A is the highest, the output current from the magnetoresistance effect element A via the read terminal AC is a minimum value Min.

When the magnetoresistance effect element A operates normally, the output current from the magnetoresistance effect element A via the read terminal AC increases as the resistance value of the magnetoresistance effect element A decreases.

When the magnetoresistance effect element A operates normally and the resistance value of the magnetoresistance effect element A is the lowest, the output current from the magnetoresistance effect element A via the read terminal AC is a maximum value Max.

In the example shown in FIG. 3, when the magnetoresistance effect element A operates normally, the output current from the magnetoresistance effect element A via the read terminal AC is a value I1.

When a malfunction which increases the output current from the magnetoresistance effect element A via the read terminal AC has occurred in the magnetoresistance effect element A, the output current from the magnetoresistance effect element A via the read terminal AC increases as indicated by an upward arrow in FIG. 3.

In the example shown in FIG. 3, when the output current from the magnetoresistance effect element A via the read terminal AC increases to a value I2, the fuse portion AC1 of the read terminal AC of the magnetoresistance effect element A is disconnected. As a result, the output current from the magnetoresistance effect element A via the read terminal AC decreases to a value I3 (specifically, decreases to zero) as indicated by a downward arrow in FIG. 3.

That is, in the example shown in FIG. 3, the output current from the magnetoresistance effect element A via the read terminal AC after the fuse portion AC1 is disconnected is smaller than the output current from the magnetoresistance effect element A via the read terminal AC during normal operation of the magnetoresistance effect element A.

Figure 4:
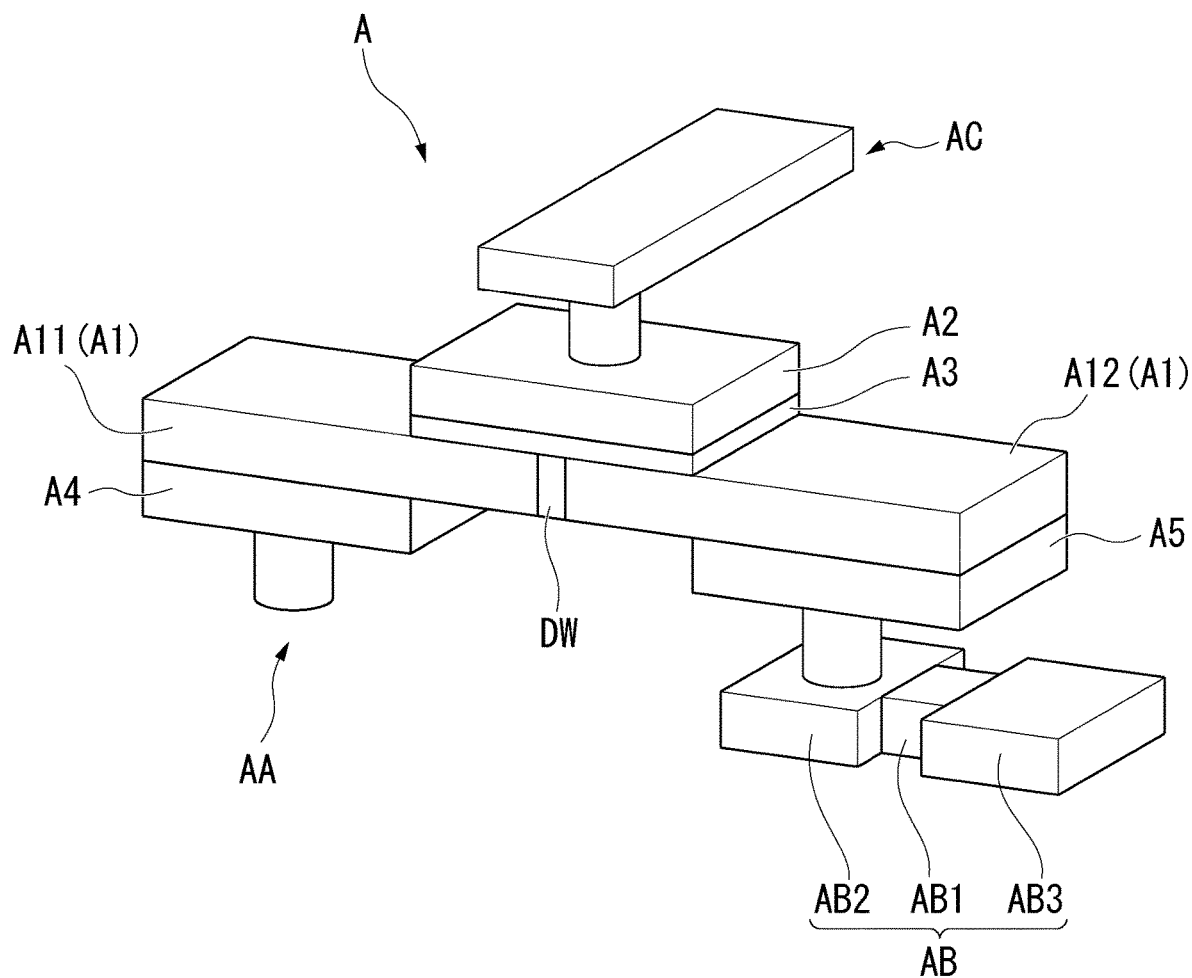
FIG. 4 is a perspective view showing a second example of a resistance change element applicable to the product-sum operation device of the first embodiment.

FIG. 4 is a perspective view showing a second example of a resistance change element applicable to the product-sum operation device 1 of the first embodiment.

In the example shown in FIG. 4, the resistance change element is a magnetoresistance effect element A exhibiting a magnetoresistance effect, similar to the example shown in FIG. 2.

In the example shown in FIG. 4, a common terminal AB includes a fuse portion AB1 and wiring portions AB2 and AB3 disposed on both sides of the fuse portion AB1, unlike the example shown in FIG. 2. When an output current from the magnetoresistance effect element A is output via the common terminal AB, the output current flows through the fuse portion AB1 and the wiring portions AB2 and AB3 in the order of the wiring portion AB2, the fuse portion AB1, and the wiring portion AB3 (that is, rightward in FIG. 4) or flows through the fuse portion AB1 and the wiring portions AB2 and AB3 in the order of the wiring portion AB3, the fuse portion AB1, and the wiring portion AB2 (that is, leftward in FIG. 4).

In the example shown in FIG. 4, the cross-sectional area of the fuse portion AB1 perpendicular to the direction in which the output current flows is set smaller than the cross-sectional area of the wiring portions AB2 and AB3 perpendicular to the direction in which the output current flows.

That is, the fuse portion AB1 is configured to be more easily disconnected than the wiring portions AB2 and AB3.

In the example shown in FIG. 4, the fuse portion AB1 is configured to be more easily disconnected than the wiring portions AB2 and AB3 by making the cross-sectional area of the fuse portion AB1 smaller than the cross-sectional area of the wiring portions AB2 and AB3. Also, in another example, the fuse portion AB1 may be configured to be more easily disconnected than the wiring portions AB2 and AB3 by forming the fuse portion AB1 in a meander shape or in a mesh shape.

In still another example, the fuse portion AB1 may be configured to be more easily disconnected than the wiring portions AB2 and AB3 by making the melting point of the material of the fuse portion AB1 lower than the melting point of the material of the wiring portions AB2 and AB3.

Figure 5:
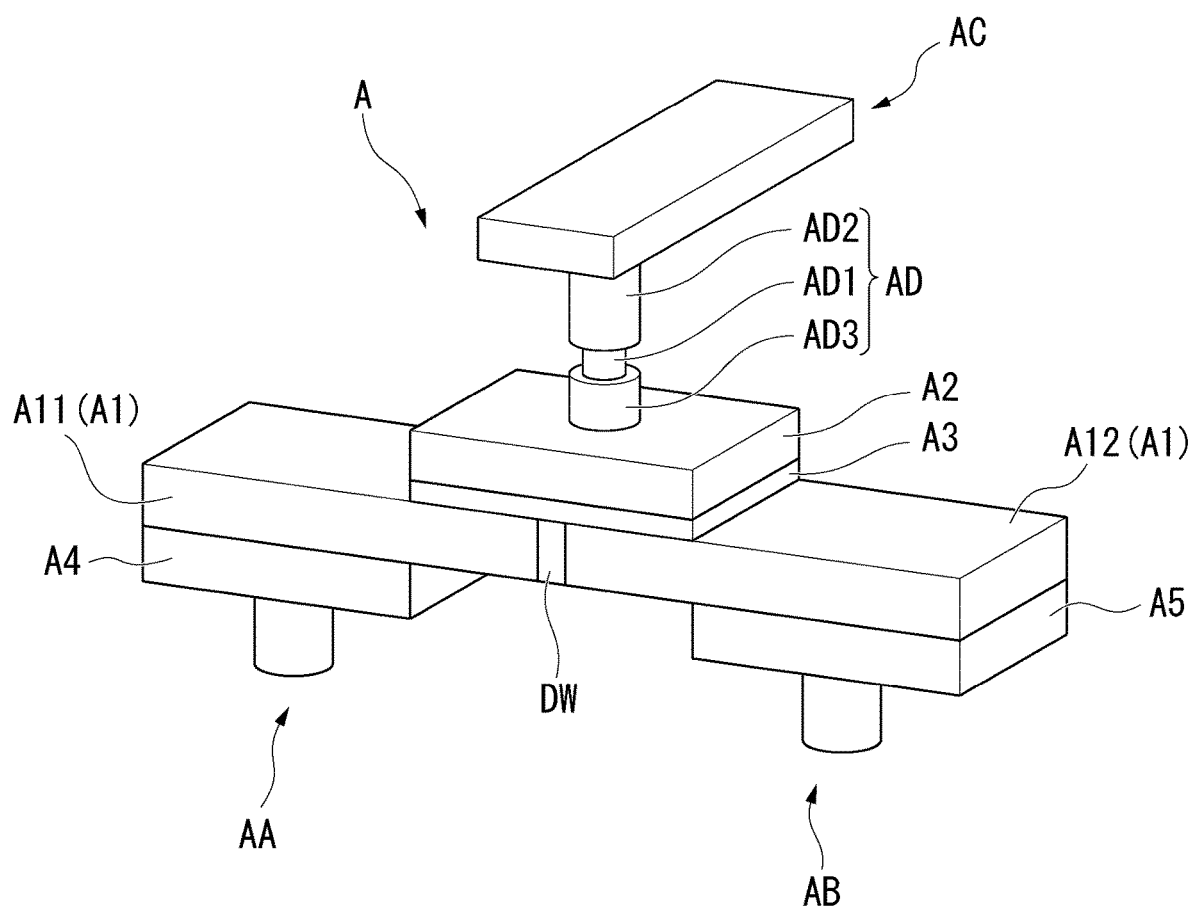
FIG. 5 is a perspective view showing a third example of a resistance change element applicable to the product-sum operation device of the first embodiment.

FIG. 5 is a perspective view showing a third example of a resistance change element applicable to the product-sum operation device 1 of the first embodiment.

In the example shown in FIG. 5, the resistance change element is a magnetoresistance effect element A exhibiting a magnetoresistance effect, similar to the example shown in FIG. 2.

The magnetoresistance effect element A includes a via AD that connects a write terminal AA or a common terminal AB and a read terminal AC. Specifically, the via AD connects a magnetization fixed layer A2 and the read terminal AC. The via AD includes a small-diameter portion AD1 and large-diameter portions AD2 and AD3 disposed on both sides of the small-diameter portion AD1. When an output current from the magnetoresistance effect element A is output through the via AD, the output current flows through the small-diameter portion AD1 and the large-diameter portions AD2 and AD3 in the order of the large-diameter portion AD2, the small-diameter portion AD1, and the large-diameter portion AD3 (that is, downward in FIG. 5) or flows through the small-diameter portion AD1 and the large-diameter portions AD2 and AD3 in the order of the large-diameter portion AD3, the small-diameter portion AD1, and the large-diameter portion AD2 (that is, upward in FIG. 5).

The small-diameter portion AD1 functions as a fuse portion that is disconnected when a malfunction which increases the output current from the magnetoresistance effect element A via the via AD has occurred in the magnetoresistance effect element A.

In the example shown in FIG. 5, the cross-sectional area of the small-diameter portion AD1 perpendicular to the direction in which the output current flows is set smaller than the cross-sectional area of the large-diameter portions AD2 and AD3 perpendicular to the direction in which the output current flows. That is, the small-diameter portion AD1 is configured to be more easily disconnected than the large-diameter portions AD2 and AD3.

In the example shown in FIG. 5, the small-diameter portion AD1 is configured to be more easily disconnected than the large-diameter portions AD2 and AD3 by making the cross-sectional area of the small-diameter portion AD1 smaller than the cross-sectional area of the large-diameter portions AD2 and AD3. Also, in another example, the small-diameter portion AD1 may be configured to be more easily disconnected than the large-diameter portions AD2 and AD3 by forming the small-diameter portion AD1 in a meander shape or in a mesh shape.

In still another example, the small-diameter portion AD1 may be configured to be more easily disconnected than the large-diameter portions AD2 and AD3 by making the melting point of the material of the small-diameter portion AD1 lower than the melting point of the material of the large-diameter portions AD2 and AD3.

In the example shown in FIG. 5, the small-diameter portion AD1 is disposed closer to the read terminal AC (on the upper side in FIG. 5) than the magnetization fixed layer A2 is. Therefore, it is possible to curb the possibility that the write terminal AA side may be affected by the disconnection of the small-diameter portion AD1.

Further, in addition to the via AD including the small-diameter portion AD1 and the large-diameter portions AD2 and AD3, the common terminal AB may include a small-diameter portion and a large-diameter portion and the small-diameter portion of the common terminal AB may function as a fuse portion.

Figure 6:
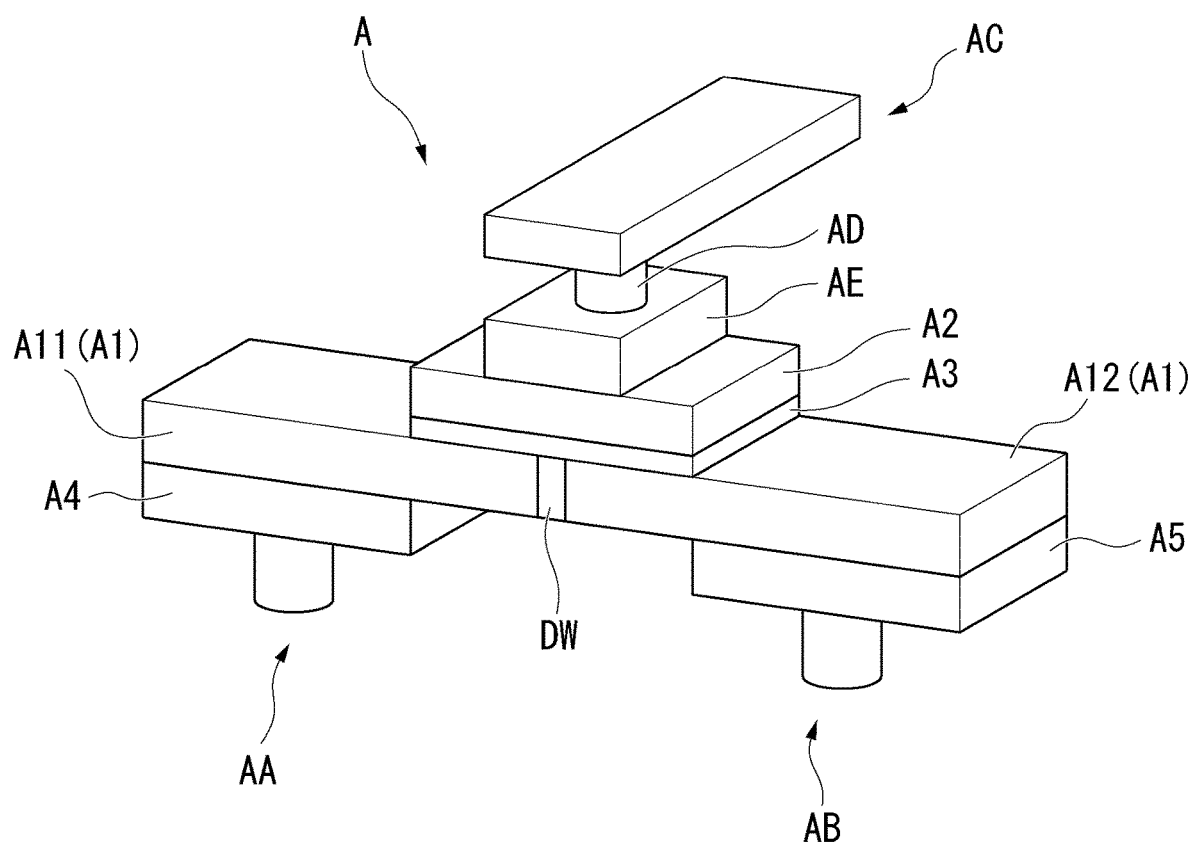
FIG. 6 is a perspective view showing a fourth example of a resistance change element applicable to the product-sum operation device of the first embodiment.

FIG. 6 is a perspective view showing a fourth example of a resistance change element applicable to the product-sum operation device 1 of the first embodiment.

In the example shown in FIG. 6, the resistance change element is a magnetoresistance effect element A exhibiting a magnetoresistance effect, similar to the example shown in FIG. 2.

The magnetoresistance effect element A includes a via AD and a low-melting-point material layer AE that connect a write terminal AA or a common terminal AB and a read terminal AC. Specifically, the via AD and the low-melting-point material layer AE connect a magnetization fixed layer A2 and the read terminal AC. When an output current from the magnetoresistance effect element A is output through the via AD and the low-melting-point material layer AE, the output current flows through the via AD and the low-melting-point material layer AE in the order of the via AD and the low-melting-point material layer AE (that is, downward in FIG. 6) or flows through the via AD and the low-melting-point material layer AE in the order of the low-melting-point material layer AE and the via AD (that is, upward in FIG. 6).

The low-melting-point material layer AE functions as a fuse portion that is disconnected when a malfunction which increases the output current from the magnetoresistance effect element A via the low-melting-point material layer AE has occurred in the magnetoresistance effect element A.

In the example shown in FIG. 6, the melting point of the low-melting-point material layer AE is set lower than the melting point of the material of the via AD. That is, the low-melting-point material layer AE is configured to be more easily disconnected than the via AD.

In the example shown in FIG. 6, the low-melting-point material layer AE is configured to be more easily disconnected than the via AD by making the melting point of the low-melting-point material layer AE lower than the melting point of the material of the via AD. Also, in another example, the low-melting-point material layer AE may be configured to be more easily disconnected than the via AD by forming the low-melting-point material layer AE in a meander shape or in a mesh shape.

In the example shown in FIG. 6, the low-melting-point material layer AE is disposed closer to the read terminal AC (on the upper side in FIG. 6) than the magnetization fixed layer A2 is. Therefore, it is possible to curb the possibility that the write terminal AA side may be affected by the disconnection of the low-melting-point material layer AE.

Figure 7:
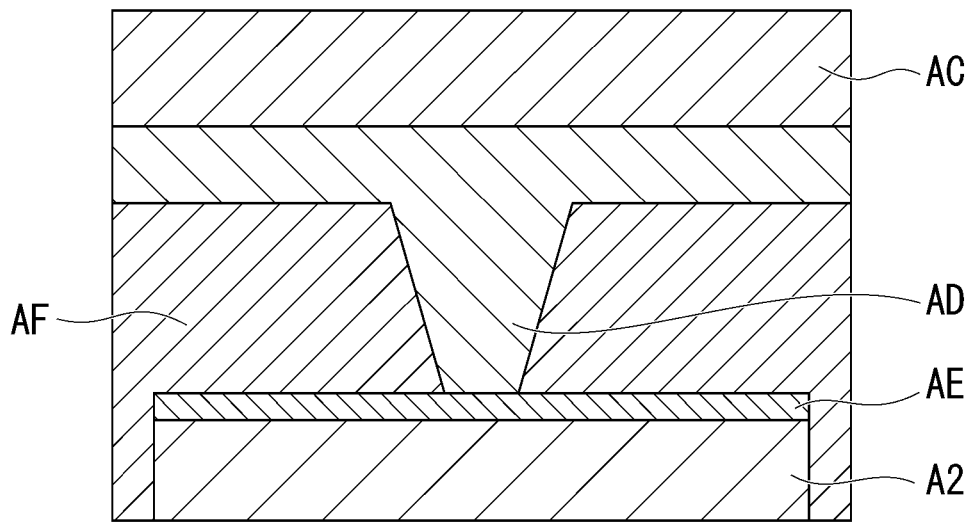
FIG. 7 is a cross-sectional view showing a fifth example of a resistance change element applicable to the product-sum operation device of the first embodiment.

FIG. 7 is a sectional view showing a fifth example of a resistance change element applicable to the product-sum operation device 1 of the first embodiment.

In the example shown in FIG. 7, the resistance change element is a magnetoresistance effect element A exhibiting a magnetoresistance effect, similar to the example shown in FIG. 2.

The magnetoresistance effect element A includes a via AD, a low-melting-point material layer AE, and an SiOx layer AF that connect a write terminal AA or a common terminal AB (see FIG. 6) and a read terminal AC. Specifically, the via AD, the low-melting-point material layer AE, and the SiOx layer AF connect a magnetization fixed layer A2 and the read terminal AC. When an output current from the magnetoresistance effect element A is output through the via AD and the low-melting-point material layer AE, the output current flows through the via AD and the low-melting-point material layer AE in the order of the via AD and the low-melting-point material layer AE (that is, downward in FIG. 7) or flows through the via AD and the low-melting-point material layer AE in the order of the low-melting-point material layer AE and the via AD (that is, upward in FIG. 7).

The low-melting-point material layer AE functions as a fuse portion that is disconnected when a malfunction which increases the output current from the magnetoresistance effect element A via the low-melting-point material layer AE has occurred in the magnetoresistance effect element A.

In the example shown in FIG. 7, the melting point of the low-melting-point material layer AE is set lower than the melting point of the material of the via AD. That is, the low-melting-point material layer AE is configured to be more easily disconnected than the via AD.

In the example shown in FIG. 7, the low-melting-point material layer AE is configured to be more easily disconnected than the via AD by making the melting point of the low-melting-point material layer AE lower than the melting point of the material of the via AD. Also, in another example, the low-melting-point material layer AE may be configured to be more easily disconnected than the via AD by forming the low-melting-point material layer AE in a meander shape or in a mesh shape.

Further, in the example shown in FIG. 7, the low-melting-point material layer AE is disposed closer to the read terminal AC (on the upper side in FIG. 7) than the magnetization fixed layer A2 is. Therefore, it is possible to curb the possibility that the write terminal AA side may be affected by the disconnection of the low-melting-point material layer AE.

Figure 8:
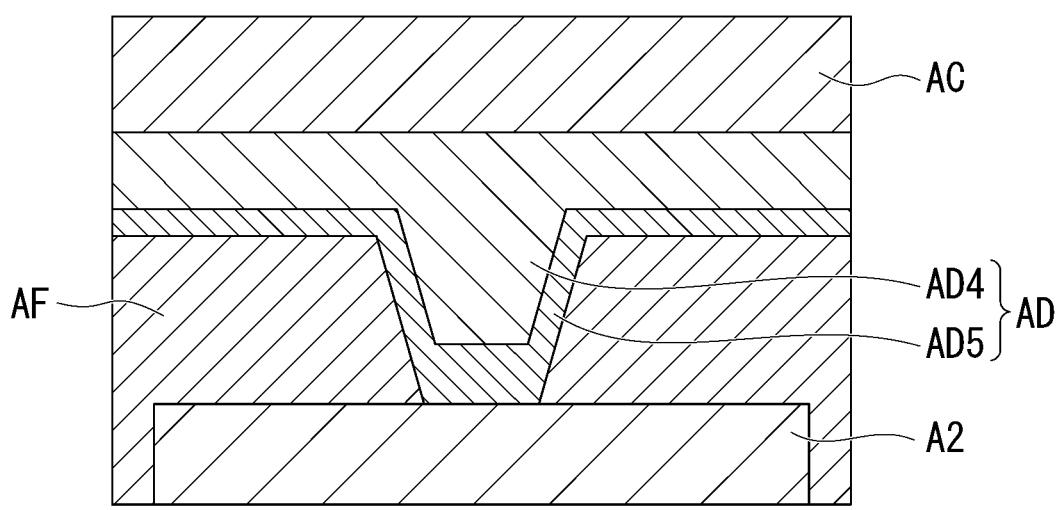
FIG. 8 is a cross-sectional view showing a sixth example of a resistance change element applicable to the product-sum operation device of the first embodiment.

FIG. 8 is a cross-sectional view showing a sixth example of a resistance change element applicable to the product-sum operation device 1 of the first embodiment.

In the example shown in FIG. 8, the resistance change element is a magnetoresistance effect element A exhibiting a magnetoresistance effect, similar to the example shown in FIG. 2.

The magnetoresistance effect element A includes a via AD and an SiOx layer AF that connect a write terminal AA or a common terminal AB (see FIG. 6) and a read terminal AC. Specifically, the via AD and the SiOx layer AF connect a magnetization fixed layer A2 and the read terminal AC. The via AD includes a wiring material portion AD4 and a low-melting-point material portion AD5 having a melting point lower than that of the wiring material portion AD4.

When an output current from the magnetoresistance effect element A is output through the wiring material portion AD4 and the low-melting-point material portion AD5 of the via AD, the output current flows through the wiring material portion AD4 and the low-melting-point material portion AD5 in the order of the wiring material portion AD4 and the low-melting-point material portion AD5 (that is, downward in FIG. 8) or flows through the wiring material portion AD4 and the low-melting-point material portion AD5 in the order of the low-melting-point material portion AD5 and the wiring material portion AD4 (that is, upward in FIG. 8).

The low-melting-point material portion AD5 functions as a fuse portion that is disconnected when a malfunction which increases the output current from the magnetoresistance effect element A via the low-melting-point material portion AD5 has occurred in the magnetoresistance effect element A.

In the example shown in FIG. 8, the melting point of the low-melting-point material portion AD5 is set lower than the melting point of the wiring material portion AD4. That is, the low-melting-point material portion AD5 is configured to be more easily disconnected than the wiring material portion AD4.

In the example shown in FIG. 8, the low-melting-point material portion AD5 is configured to be more easily disconnected than the wiring material portion AD4 by making the melting point of the low-melting-point material portion AD5 lower than the melting point of the wiring material portion AD4. However, in another example, the low-melting-point material portion AD5 may be configured to be more easily disconnected than the wiring material portion AD4 by forming the low-melting-point material portion AD5 in a meander shape or in a mesh shape.

In the example shown in FIG. 8, the low-melting-point material portion AD5 is disposed closer to the read terminal AC (on the upper side in FIG. 8) than the magnetization fixed layer A2 is. Therefore, it is possible to curb the possibility that the write terminal AA side may be affected by the disconnection of the low-melting-point material portion AD5.

Figure 9:
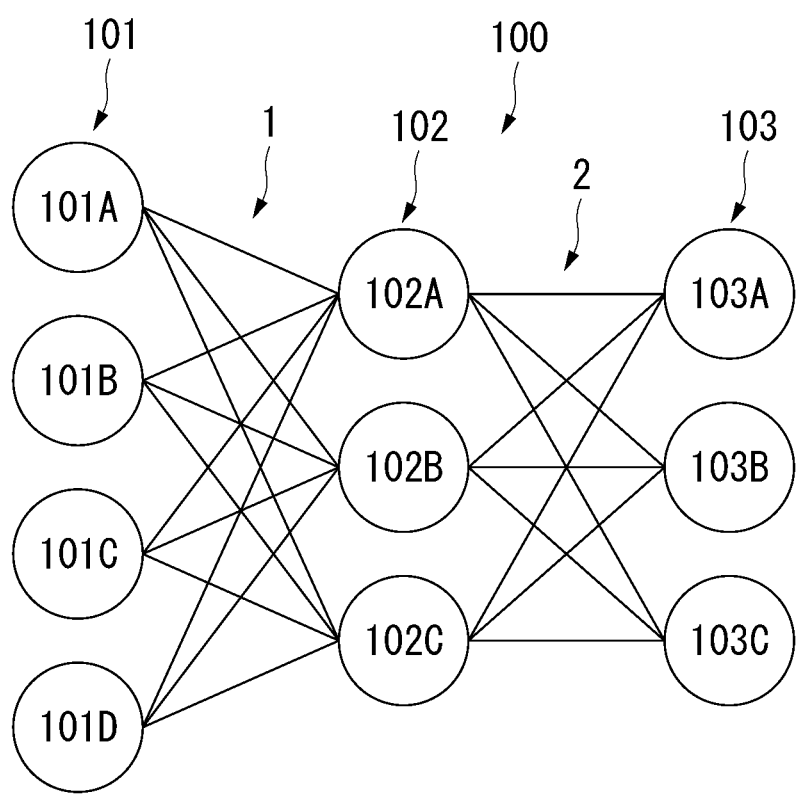
FIG. 9 is a diagram showing an exemplary application of the product-sum operation device of the first embodiment.

FIG. 9 is a diagram showing an exemplary application of the product-sum operation device 1 of the first embodiment.

In the example shown in FIG. 9, the product-sum operation device 1 of the first embodiment is applied to a neuromorphic device 100. The neuromorphic device 100 includes an input layer 101, a hidden layer 102, an output layer 103, the product-sum operation device 1 of the first embodiment, and a product-sum operation device 2. The product-sum operation device 2 includes a plurality of product operation elements, similar to the product-sum operation device 1 of the first embodiment shown in FIG. 1.

The input layer 101 includes, for example, four nodes 101A, 101B, 101C, and 101D. The hidden layer 102 includes, for example, three nodes 102A, 102B, and 102C. The output layer 103 includes, for example, three nodes 103A, 103B, and 103C.

The product-sum operation device 1 is disposed between the input layer 101 and the hidden layer 102 and connects the four nodes 101A, 101B, 101C, and 101D of the input layer 101 and the three nodes 102A, 102B, and 102C of the hidden layer 102. The product-sum operation device 1 changes weights by changing the resistance values of the product operation elements 10AA to 10AC and 10BA to 10BC shown in FIG. 1.

The product-sum operation device 2 is disposed between the hidden layer 102 and the output layer 103. The product-sum operation device 2 connects the three nodes 102A, 102B, and 102C of the hidden layer 102 and the three nodes 103A, 103B, and 103C of the output layer 103. The product-sum operation device 2 changes weights by changing the resistance values of the plurality of product operation elements.

The hidden layer 102 uses an activation function (for example, a sigmoid function).

In intensive studies, the present inventor found that the functions of the neuromorphic device 100 deteriorate when the characteristics of the product operation elements 10AA to 10AC and 10BA to 10BC constituting the product-sum operation device 1 change for some reason (specifically, when the product operation elements 10AA to 10AC and 10BA to 10BC have malfunctioned).

In particular, the product-sum operation function of the product-sum operation device 1 and the performance of the neural network were found to be greatly impaired when the product operation elements 10AA to 10AC and 10BA to 10BC malfunction in a short-circuiting mode (that is, when an output current increase malfunction occurs in the product operation elements 10AA to 10AC and 10BA to 10BC).

Specifically, in intensive studies, the present inventor found that the product-sum operation function of the product-sum operation device 1 and the performance of the neural network are more seriously impaired when an output current increase malfunction occurs in the product operation elements 10AA to 10AC and 10BA to 10BC than when an output current decrease malfunction occurs in the product operation elements 10AA to 10AC and 10BA to 10BC. This is because a current concentrates on the malfunctioning resistance change element, whereby weights of the other resistance change elements (currents from the other resistance change elements) are ignored in the circuit.

In the product-sum operation device provided in the neuromorphic device, the fuse portion is included in the common terminal such that the fuse portion is provided closer to the outer surface of the neuromorphic device than the core portions (the magnetization free layer, the magnetization fixed layer, and the nonmagnetic layer) of the magnetoresistance effect element, which is a resistance change element are. With this configuration, even if the fuse portion functions and is disconnected, this has a small influence.

As described above, the product-sum operation device 1 of the first embodiment has a fuse function that is disconnected when a malfunction which increases the output current from the product operation elements 10AA to 10AC and 10BA to 10BC (the resistance change elements and the magnetoresistance effect element A) has occurred in the product operation elements 10AA to 10AC and 10BA to 10BC.

Therefore, according to the product-sum operation device 1 of the first embodiment, it is possible to curb the possibility that the performance of the neural network may be greatly impaired.

Further, in the product-sum operation device 1 of the first embodiment, as described above, the portion having the fuse function is disposed closer to the read terminal AC than the magnetization fixed layer A2 is. Therefore, it is possible to curb the possibility that the write terminal AA side may be affected by the disconnection of the portion having the fuse function.

<Second Embodiment> (where Resistance Change Elements are Magnetoresistance Effect Elements and a Destructive Process is Applied)

Hereinafter, a second embodiment of the product-sum operation device of the present invention will be described.

The product-sum operation device 1 of the second embodiment is configured similar to the product-sum operation device 1 of the first embodiment described above, except for the points described below. Therefore, according to the product-sum operation device 1 of the second embodiment, the same effects as those of the product-sum operation device 1 of the first embodiment described above can be obtained except for the points described below.

In the product-sum operation device 1 of the first embodiment described above, a voltage higher than a read voltage is not applied to each of the plurality of product operation elements 10AA to 10AC and 10BA to 10BC. However, in the product-sum operation device 1 of the second embodiment, a voltage higher than the read voltage is applied to each of the plurality of product operation elements 10AA to 10AC and 10BA to 10BC.

In the case where the product operation elements 10AA to 10AC and 10BA to 10BC are used as magnetoresistance effect elements, the "read voltage" refers to a voltage that is applied to the magnetoresistance effect elements when data written in the magnetoresistance effect elements is read.

When the product-sum operation device 1 of the second embodiment is used, first, a voltage higher than the read voltage is applied to each of the plurality of product operation elements 10AA to 10AC and 10BA to 10BC. As a result, an unstable element (that is, an element that may cause a malfunction which increases the output current) among the plurality of product operation elements 10AA to 10AC and 10BA to 10BC is destroyed in advance. Therefore, according to the product-sum operation device 1 of the second embodiment, it is possible to curb the possibility that the performance of the neural network may be greatly impaired due to the occurrence of a malfunction which increases the output current.

Next, when the product-sum operation device 1 of the second embodiment is used, elements that have not been destroyed among the plurality of product operation elements 10AA to 10AC and 10BA to 10BC are allowed to operate normally. That is, a read voltage is applied to at least one of the plurality of product operation elements 10AA to 10AC and 10BA to 10BC.

<Third Embodiment> (where Resistance Change Elements are General Variable Resistors and No Destruction Process is Applied)

Hereinafter, a third embodiment of the product-sum operation device of the present invention will be described.

The product-sum operation device 1 of the third embodiment is configured similar to the product-sum operation device 1 of the first embodiment described above, except for the points described below. Therefore, according to the product-sum operation device 1 of the third embodiment, the same effects as those of the product-sum operation device 1 of the first embodiment described above can be obtained except for the points described below.

Figure 10:
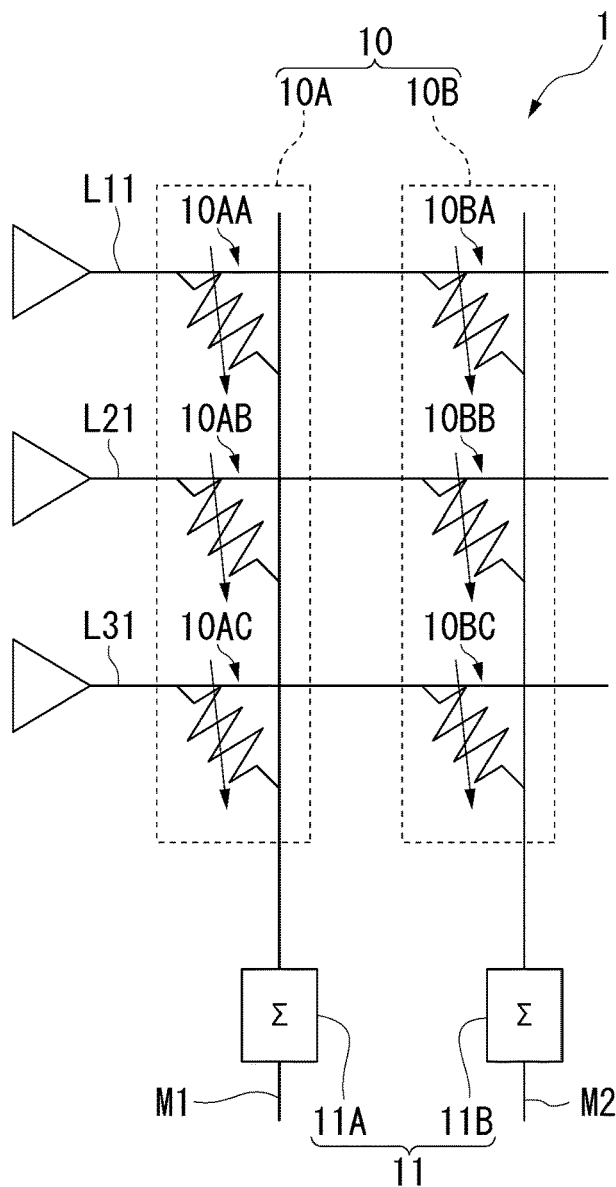
FIG. 10 is a diagram showing an exemplary configuration of a product-sum operation device of a third embodiment.

FIG. 10 is a diagram illustrating an exemplary configuration of the product-sum operation device 1 of the third embodiment.

In the product-sum operation device 1 of the first embodiment, the product operation elements 10AA to 10AC and 10BA to 10BC are constituted by magnetoresistance effect elements A. On the other hand, in the product-sum operation device 1 of the third embodiment, product operation elements 10AA to 10AC and 10BA to 10BC are constituted by arbitrary resistance change elements (variable resistors).

Figure 11:
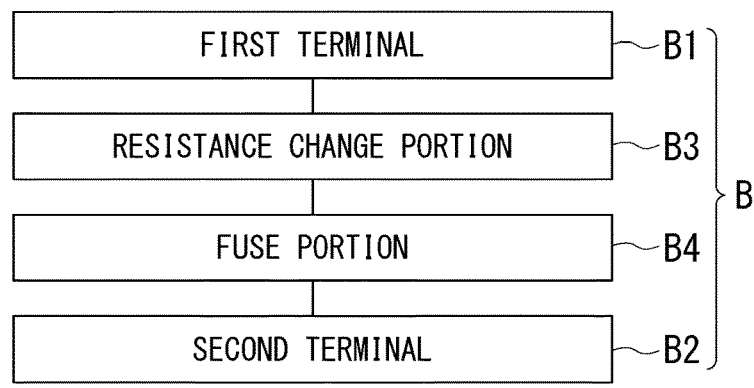
FIG. 11 is a diagram showing an exemplary configuration of a resistance change element applicable to the product-sum operation device of the third embodiment.

FIG. 11 is a diagram illustrating an exemplary configuration of a resistance change element B applicable to the product-sum operation device 1 of the third embodiment.

In the example shown in FIG. 1, each of the plurality of product operation elements 10AA to 10AC and 10BA to 10BC is a magnetoresistance effect element A including a read terminal AC, a write terminal AA, and a common terminal AB. In the example shown in FIGS. 10 and 11, each of the plurality of product operation elements 10AA to 10AC and 10BA to 10BC is a resistance change element B including a first terminal B1 and a second terminal B2. The resistance change element B further includes a resistance change portion B3 and a fuse portion B4. One end of the resistance change portion B3 is connected to the first terminal B1 and the other end of the resistance change portion B3 is connected to the second terminal B2 via the fuse portion B4.

In the example shown in FIG. 10, the first terminals of the product operation elements 10AA and 10BA are connected to a line L11. The first terminals of the product operation elements 10AB and 10BB are connected to a line L21. The first terminals of the product operation elements 10AC and 10BC are connected to a line L31.

The second terminals of the product operation elements 10AA, 10AB, and 10AC are connected to a line M1. The second terminals of the product operation elements 10BA, 10BB, and 10BC are connected to a line M2.

A sum operator 11 includes an output detector 11A that detects the sum of outputs from the second terminals of the product operation elements 10AA, 10AB, and 10AC and an output detector 11B that detects the sum of outputs from the second terminals of the product operation elements 10BA, 10BB, and 10BC.

Although embodiments of the present invention have been described above in detail with reference to the drawings, the specific configurations thereof are not limited to those of the embodiments and also include various modifications and substitutions without departing from the spirit of the present invention. The specific configurations may also include combinations of the configurations described in the above embodiments.

For example, a program for realizing the functions of each device (for example, the product-sum operation device 1) according to the embodiments shown above may be recorded on a computer-readable recording medium (storage medium) and a computer system may be caused to read and execute the program recorded on the recording medium to perform the processing.

The "computer system" referred to here may include an operating system (OS) or hardware such as peripheral devices.

The "computer-readable recording medium" refers to a portable medium such as a flexible disk, a magneto-optical disk, a read-only memory (ROM), a writable nonvolatile memory such as a flash memory, or a digital versatile disc (DVD), or a storage device such as a hard disk provided in a computer system. The recording medium may be, for example, a recording medium that temporarily records data.

It is assumed that the "computer-readable recording medium" includes one that holds the program for a certain period of time, like a volatile memory (for example, a dynamic random-access memory (DRAM)) provided in a computer system which serves as a server or a client when the program has been transmitted via a network such as the Internet or a communication line such as a telephone line.

The program may also be transmitted from a computer system in which the program is stored in a storage device or the like to another computer system via a transmission medium or by transmission waves in the transmission medium. Here, the "transmission medium" for transmitting the program refers to a medium having a function of transmitting information, like a network (a communication network) such as the Internet or a communication line (a communication wire) such as a telephone line.

The program may be one for realizing some of the above-described functions. The program may also be a so-called differential file (differential program) which can realize the above-described functions in combination with a program already recorded in the computer system.

In a computer, for example, a processor such as a central processing unit (CPU) reads and executes the program stored in a memory.

REFERENCE SIGNS LIST

1 Product-sum operation device
2 Product-sum operation device
10 Product operator
10A Column
10AA Product operation element
10AB Product operation element
10AC Product operation element
10B Column
10BA Product operation Element
10BB Product operation element
10BC Product operation element
11 Sum operator
11A Output detector
11B Output detector
100 Neuromorphic device
101 Input layer
101A, 101B, 101C, 101D Node
102 Hidden layer
102A, 102B, 102C Node
103 Output layer
103A, 103B, 103C Node
A Magnetoresistance effect element
AA Write terminal
AB Common terminal
AB1 Fuse portion
AB2, AB3 Wiring portion
AC Read terminal
AC1 Fuse portion
AC2, AC3 Wiring portion
AD Via
AD1 Small-diameter portion
AD2 Large-diameter portion
AD3 Large-diameter portion
AD4 Wiring material portion
AD5 Low-melting-point material portion
AE Low-melting-point material layer
AF SiOx layer
A1 Magnetization free layer
A11 First region
A12 Second region
A2 Magnetization fixed layer
A3 Nonmagnetic layer
B Resistance change element
B1 First terminal
B2 Second terminal
B3 Resistance change portion
B4 Fuse portion
DW Domain wall
L11 Line L12 Line
L21 Line
L22 Line
L31 Line
L32 Line
M1 Line
M2 Line

What is claimed:

1. A product-sum operation device comprising:
a product operator including a plurality of product operation elements connected to a line, each of the product operation elements being a resistance change element having;
a write terminal;
a common terminal;
a read terminal; and
a fuse portion included in the common terminal or the read terminal, the fuse portion being configured to be disconnected when a malfunction which increases an output current from the resistance change element has occurred in the resistance change element; and
a sum operator connected to the line connected to the plurality of product operation elements, the sum operator including an output detector configured to detect a sum of outputs from the plurality of product operation elements.

2. The product-sum operation device according to claim 1, wherein the output current from one of the resistance change elements after the fuse portion is disconnected is smaller than the output current from the one resistance change element during normal operation of the one resistance change element.

3. The product-sum operation device according to claim 1, wherein the one of the resistance change elements is a magnetoresistance effect element exhibiting a magnetoresistance effect, and
the magnetoresistance effect element includes:
a magnetization free layer having a domain wall;
a magnetization fixed layer whose magnetization direction is fixed; and
a nonmagnetic layer sandwiched between the magnetization free layer and the magnetization fixed layer.

4. The product-sum operation device according to claim 3, wherein
the fuse portion of one of the resistance change elements is disposed closer to the read terminal than the magnetization fixed layer is.

5. The product-sum operation device according to claim 1, wherein the read terminal of one of the resistance change elements further includes a wiring portion,
the output current flows through the wiring portion and the fuse portion in an order of the wiring portion and the fuse portion or in an order of the fuse portion and the wiring portion, and
a cross-sectional area of the fuse portion perpendicular to a direction in which the output current flows is smaller than a cross-sectional area of the wiring portion perpendicular to the direction in which the output current flows.

6. The product-sum operation device according to claim 1, wherein the read terminal of one of the resistance change elements further includes a wiring portion,
the output current flows through the wiring portion and the fuse portion in an order of the wiring portion and the fuse portion or in an order of the fuse portion and the wiring portion, and
the fuse portion is more easily disconnected than the wiring portion when a malfunction which increases the output current has occurred in the one resistance change element.

7. The product-sum operation device according to claim 1, wherein the read terminal of one of the resistance change elements further includes a wiring portion,
the output current flows through the wiring portion and the fuse portion in an order of the wiring portion and the fuse portion or in an order of the fuse portion and the wiring portion, and
a melting point of a material of the fuse portion is lower than a melting point of a material of the wiring portion.

8. The product-sum operation device according to claim 1, further comprising:
a via associated with one of the resistance change elements, and that connects between the write terminal or the common terminal and the one resistance change element, or connects between the read terminal and the one resistance change element, the via including:
a small-diameter portion that functions as the fuse portion; and
a large-diameter portion, the output current flowing through the small-diameter portion and the large-diameter portion in an order of the small-diameter portion and the large-diameter portion or in an order of the large-diameter portion and the small-diameter portion.

9. The product-sum operation device according to claim claim 1, wherein the common terminal of one of the resistance change elements includes a small-diameter portion and a large-diameter portion,
the output current flows through the small-diameter portion and the large-diameter portion in an order of the small-diameter portion and the large-diameter portion or in an order of the large-diameter portion and the small-diameter portion, and
the small-diameter portion functions is the fuse portion.

10. The product-sum operation device according to claim 1, wherein the common terminal of one of the resistance change elements includes a wiring portion,
the output current flows through the wiring portion and the fuse portion in an order of the wiring portion and the fuse portion or in an order of the fuse portion and the wiring portion, and
a cross-sectional area of the fuse portion perpendicular to a direction in which the output current flows is smaller than a cross-sectional area of the wiring portion perpendicular to the direction in which the output current flows.

11. The product-sum operation device according to claim 1, wherein the common terminal of one of the resistance change elements includes a wiring portion,
the output current flows through the wiring portion and the fuse portion in an order of the wiring portion and the fuse portion or in an order of the fuse portion and the wiring portion, and
the fuse portion is more easily disconnected than the wiring portion when a malfunction which increases the output current has occurred in the resistance change element.

12. The product-sum operation device according to claim 1, wherein the common terminal of one of the resistance change elements includes a wiring portion, the output current flows through the wiring portion and the fuse portion in an order of the wiring portion and the fuse portion or in an order of the fuse portion and the wiring portion, and a melting point of a material of the fuse portion is lower than a melting point of a material of the wiring portion.

13. The product-sum operation device according to claim 1, further comprising:

a via associated with one of the resistance change elements; and a low-melting-point material layer, the via and the low melting point material layer connecting between the write terminal or the common terminal and the one resistance change element, or connecting between the read terminal and the one resistance change element, the output current flowing through the via and the low-melting-point material layer in an order of the via and the low-melting-point material layer or in an order of the low-melting-point material layer and the via, and the low-melting-point material layer functioning as the fuse portion.

14. The product-sum operation device according to claim 1, further comprising:

via associated with one of the resistance change elements, and that connects between the write terminal or the common terminal and the one resistance change element, or connects between the read terminal and the one resistance change element, the via including:

a wiring material portion; and a low-melting-point material portion having a lower melting point than the wiring material portion, the output current flowing; through the wiring material portion and the low-melting-point material portion in an order of the wiring material portion and the low-melting-point material portion or in an order of the low-melting-point material portion and the wiring material portion, and the low-melting-point material portion functioning as the fuse portion.

15. A neuromorphic device comprising the product-sum operation device according to claim 1.

16. A neuromorphic device comprising the product-sum operation device according to claim 1, wherein one of the resistance change elements is a magnetoresistance effect element exhibiting a magnetoresistance effect and including a magnetization free layer having a domain wall, a magnetization fixed layer whose magnetization direction is fixed, and a nonmagnetic layer sandwiched between the magnetization free layer and the magnetization fixed layer, the fuse portion is included in the common terminal, and the fuse portion is disposed closer to an outer surface of the neuromorphic device than the magnetization free layer, the magnetization fixed layer, and the nonmagnetic layer are.

17. A method for using the product-sum operation device according to claim 1, the method comprising:

a first step of applying a voltage higher than a read voltage of the resistance change element to each of the plurality of product operation elements; and a second step of applying the read voltage to at least one of the plurality of product operation elements.

* * * * *